United States Patent [19]
Hayashida

[11] Patent Number: 6,137,300
[45] Date of Patent: Oct. 24, 2000

[54] TEST PROBE DEVICE FOR A DISPLAY PANEL AND TEST PROBE POSITIONING METHOD

[75] Inventor: Manabu Hayashida, Tokyo, Japan

[73] Assignee: NEC Corporation, Tokyo, Japan

[21] Appl. No.: 09/138,331

[22] Filed: Aug. 24, 1998

[30] Foreign Application Priority Data

Aug. 22, 1997 [JP] Japan ................................ 9-226762

[51] Int. Cl.⁷ .................................................. G01R 1/04
[52] U.S. Cl. ............................................ 324/758; 324/770
[58] Field of Search .................................... 324/758, 755, 324/760, 765, 500, 158.1, 73.1, 770, 537; 33/533

[56] References Cited

U.S. PATENT DOCUMENTS

| | | | |
|---|---|---|---|
| 5,091,692 | 2/1992 | Ohno et al. | 324/758 |
| 5,410,259 | 4/1995 | Fujihara et al. | 324/758 |
| 5,585,738 | 12/1996 | Kuji et al. | 324/754 |

FOREIGN PATENT DOCUMENTS

| | | |
|---|---|---|
| 1-121778 | 5/1989 | Japan . |
| 2-90 | 1/1990 | Japan . |
| 3-218477 | 9/1991 | Japan . |
| 4-134482 | 5/1992 | Japan . |

Primary Examiner—Vinh P. Nguyen
Attorney, Agent, or Firm—Sughrue, Mion, Zinn, Macpeak & Seas, PLLC

[57] ABSTRACT

A probe device that includes a plurality of actuators respectively associated with a plurality of probe units. The probe device is adaptive to various display panels each having electrode terminals arranged at a particular pitch, without resorting to additional probe units. The probe device is therefore feasible for general-purpose applications and low in operation cost. In addition, the probe device allows electrode terminals and probes to be accurately aligned with each other. This enhances accurate testing, surely excludes defective products, and frees the subsequent steps from wasteful cost. A method of positioning the probes is also disclosed.

4 Claims, 3 Drawing Sheets

TEST PROBE DEVICE FOR A DISPLAY PANEL AND TEST PROBE POSITIONING METHOD

BACKGROUND OF THE INVENTION

The present invention relates to a probe device for testing the electric characteristic of a display panel having a number of test pads arranged on a substrate, and a method of positioning probes.

Today, display panels of various sizes and configurations, including a rectangular and a square configuration, are available and extensively used with a broad range of television (TV) receivers. A display panel has electrode terminals arranged in a vertical array and a horizontal array therein. It has been customary to test a display panel with a probe head having probes corresponding in number to the electrode terminals of the display panel. For a test, after the probes have been brought into contact with the electrode terminals, signals are interchanged between the probe head and a tester body. However, this kind of scheme has the following problem unsolved. As for a large size TV receiver having a broad screen and numerous pixels, it is necessary to prepare a probe head having numerous probes equal in number to the electrode terminals of a display panel, and to repeat a test by separating the electrode terminals and probes into a plurality of groups. The test, therefore, needs a substantial period of time to complete.

Japanese Patent Laid-Open Publication No. 4-134482 discloses probes for a display panel capable of reducing the testing time. The probes taught in this document are implemented by thin wires arranged at the same pitch as the electrodes of a display panel or by a tab substrate. A plurality of probe assemblies each having such probes are combined horizontally and vertically and integrally mounted to a frame. For the measurement of the electric characteristic of a display panel, the probes are brought into contact with all of the electrode terminals of the display panel at the same time.

The above probe assemblies each is provided with a respective manipulator for adjusting the positions of the ends of the probes. With the manipulators, it is possible to reduce the number of probe assemblies to be combined for the number of electrode terminals increasing with an increase in the size of a display panel. Specifically, each manipulator is capable aligning the probes of the associated probe assembly with the electrode terminals of a display panel.

However, it is difficult for the conventional probe assemblies to deal with display panels each having electrode terminals arranged at a particular pitch. Specifically, every time the pitch of the electrode terminals changes, the probe assemblies must be replaced and adjusted. That is, various probe assembly units each assigned to a particular pitch must be prepared, increasing the operation cost. Further, if the probes of the individual probe assembly unit are aligned with the electrode terminals by eye, then a prohibitive number of adjusting steps are necessary, depending on the person. Moreover, whether or not the probes and electrode terminals are accurately aligned can be determined only after the start of measurement.

Technologies relating to the present invention are also disclosed in, e.g., Japanese Patent Laid-Open Publication Nos. 1-121778, 2-90, and 3-218472.

SUMMARY OF THE INVENTION

It is therefore an object of the present invention to provide a probe device adaptive to various kinds of display panels each having electrode terminals arranged at a particular pitch, and capable of aligning probes and electrode terminals with accuracy, and a probe positioning method.

In accordance with the present invention, a probe device for a display panel includes a first probe unit including a plurality of probes capable of contacting electrode terminals arranged on the display panel at first preselected intervals. A second probe unit includes a plurality of probe units capable of contacting electrode terminals arranged at second preselected intervals different from the first preselected intervals. An actuator includes a connecting mechanism for allowing either one of the first and second probe units to be plugged in the actuator, and a moving mechanism for moving the first or second probe unit plugged in. A probe head includes a base plate on which a plurality of probe assembly units each having the actuator and first or second probe unit are arranged side by side along the edges of an opening formed in the base plate. The display panel is laid on a stage. A compound table selectively moves the stage in the rotational direction or in the X or Y direction. Alignment cameras are used to identify alignment marks provided on the display panel. A controller drives the actuator, interchanging signals with the first or second probe and a tester body, and performs sequence control.

Also, in accordance with the present invention, a probe positioning method begins with the step of aligning the center of a square or rectangular area defined by electrode terminals arranged in perpendicular directions on a display panel and the center of a square or rectangular area defined by probes arranged in perpendicular directions on a probe head. The probes are caused to to contact the electrode terminals. The probes are divided into a plurality of blocks each having a preselected number of probes. Each of the plurality of blocks is positioned while the resistance of circuitry including the outermost probes of the block and the electrode terminals contacting them is measured to thereby align the probes and electrode terminals.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENT

Figure 1A:
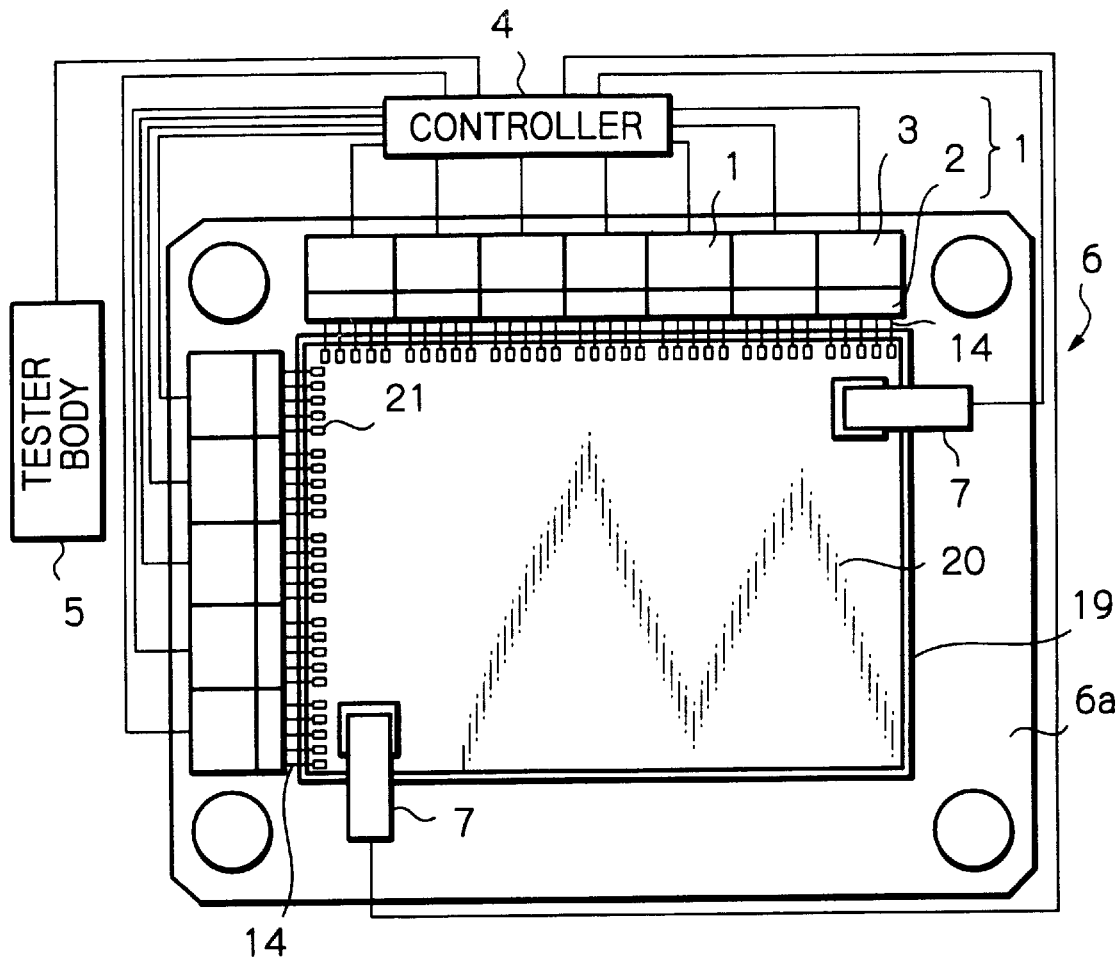
FIGS. 1A and 1B show a probe device for a display panel embodying the present invention.
Figure 1B:
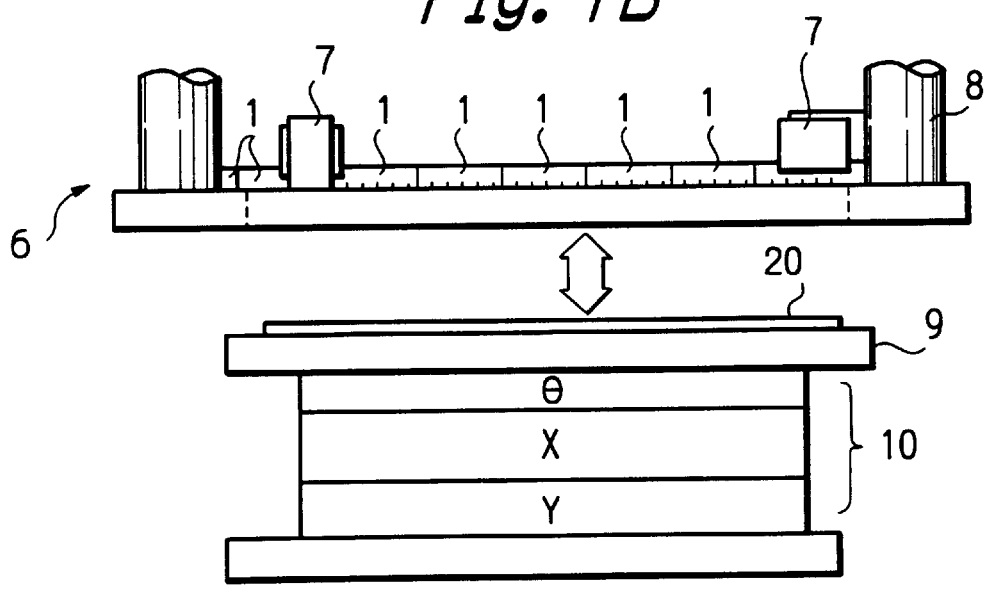

Referring to FIGS. 1A and 1B, a probe device for a display panel embodying the present invention is shown. As shown, the probe device includes probe units 2 each having an array of probes 14 protruding from the front and an array of plugs, not shown, protruding from the rear and integral with the probes 14. Actuators 3 each is assigned to one of the probe units 2 and causes the probe unit 2 to slightly move in directions perpendicular to each other. Each probe unit 2 and associated actuator 3 constitute a probe assembly unit 1. A probe head 6 is movable up and down and made up of a base plate 6a and poles 8 supporting the base plate 6a. The probe assembly units 1 are mounted on the base plate 6a side by side along the edges of an opening 19 formed in the base plate 6a. A display panel 20 to be tested is laid on a stage 9. A compound table 10 selectively moves the stage 9 in the rotational direction or in the direction X or Y. Alignment cameras 7 are used to identify alignment marks provided on the display panel 20. A controller 4 drives the actuators 3, interchanges signals with the probes 14 and a tester body 5, and performs sequence control.

Figure 2A:
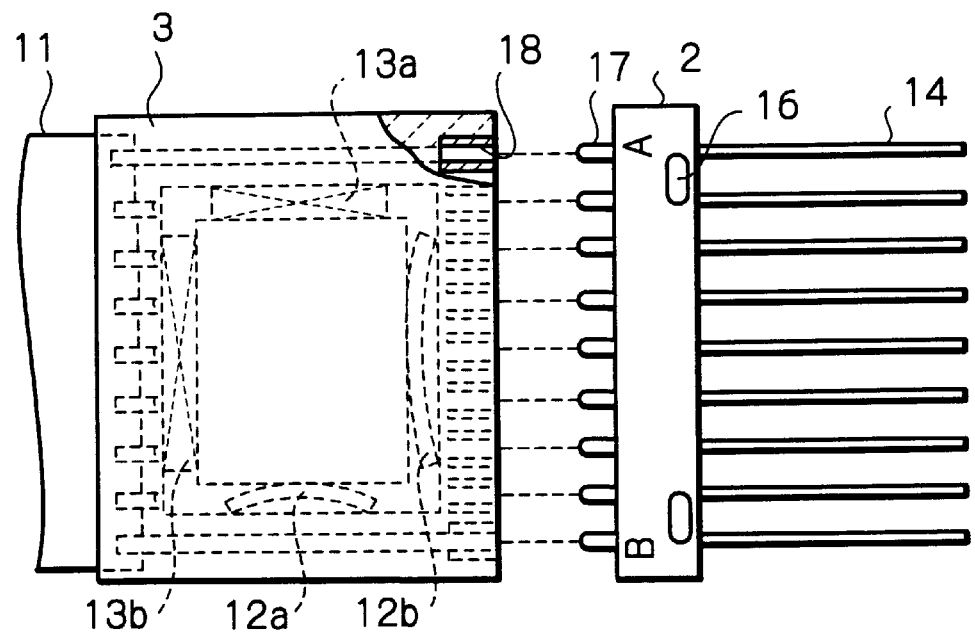
FIGS. 2A–2C show a probe assembly unit included in the illustrative embodiment.
Figure 2B:
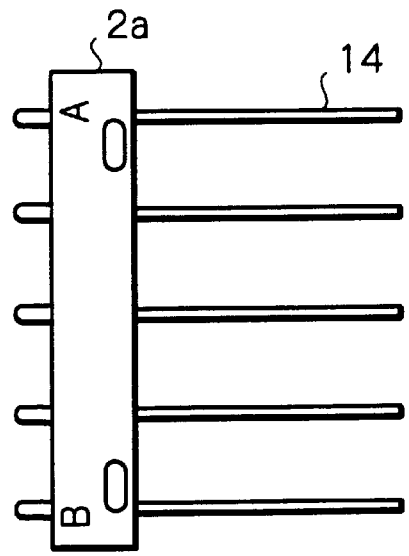
Figure 2C:
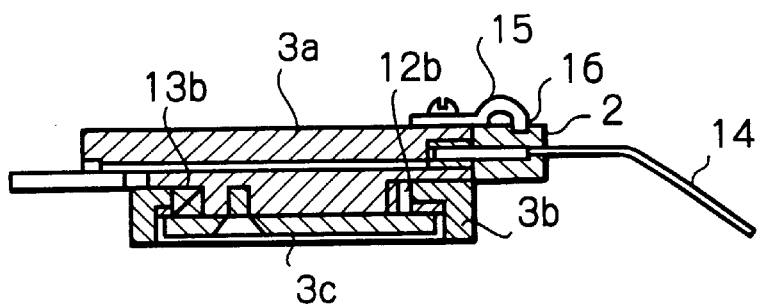

As shown in FIG. 2A, in each probe assembly unit 1, the other ends of the probes 14 of each probe unit 2 constitute plugs 17 mentioned above. The probe unit 2 is mounted to the associated actuator 3 with its plugs 17 inserted into bushes 18 formed in the actuator 3. In this configuration, the probe unit 2 having a comparatively small pitch can be easily replaced with a probe unit 2 having a comparatively great pitch if the plugs 17 are pulled out of the bushes 18. As shown in FIG. 2C, a hook 15 snaps into a groove 16 formed in the probe unit 2 in order to prevent the probe unit 2 from slipping out. The bushes 18 each is held in contact with one of the probes 14.

Leads respectively connected to the bushes 18 at one end are connected to the conductors of a soft flat cable 11 connected to the rear of the actuator 3. Each probe 14 and associated plug 17 are formed integrally with each other and implemented as a resilient rod of a good conductor, e.g., beryllium copper. The plugs 17 each is formed with a slit and provided with a diameter easy to enter the associated bush 18. Such rods are sealed with resin by a precise metal mold and formed on a resin frame, constituting the probe unit 2.

The actuator 3 has, in addition to the bushes 18, a movable portion 3a in which the leads are buried, and a stationary portion 3b affixed to the base plate 6a, FIG. 1A. Piezoelectric devices 13a and 13b cause the movable portion 3a to move with their forces acting in the direction of thickness. Specifically, the piezoelectric devices 13a and 13b each moves the movable portion 3a in the direction X or Y against the action of a leaf spring 12a or 12b facing the devices 13a or 13b. A plate 3c prevents the movable portion 3a from slipping out from the stationary portion 3b. A sheet formed of, e.g., Teflon is adhered to each portion where the stationary portion 3b and plate contact each other, promoting the smooth movement of the movable portion 3a.

The piezoelectric devices 13a and 13b are formed of, e.g., PZT (ceramics based on plumbum zircon titanate), and each is implemented as a laminate of a plurality of elements so as to achieve a maximum displacement of 50 $\mu$m when applied with a DC voltage of 100 V. Further, the piezoelectric devices 13a and 13b each remains in its medium position when applied with a voltage of 50 V and moves the movable portion 3a by one step when the voltage of 50V is raised or lowered by 10 V stepwise. The leaf springs 12a and 12b are formed of spring steel having a great spring constant and constantly press the movable portion 3a toward the piezoelectric devices 13a and 13b, respectively, so that the movable portion 3a is prevented from being dislocated.

Figure 3:
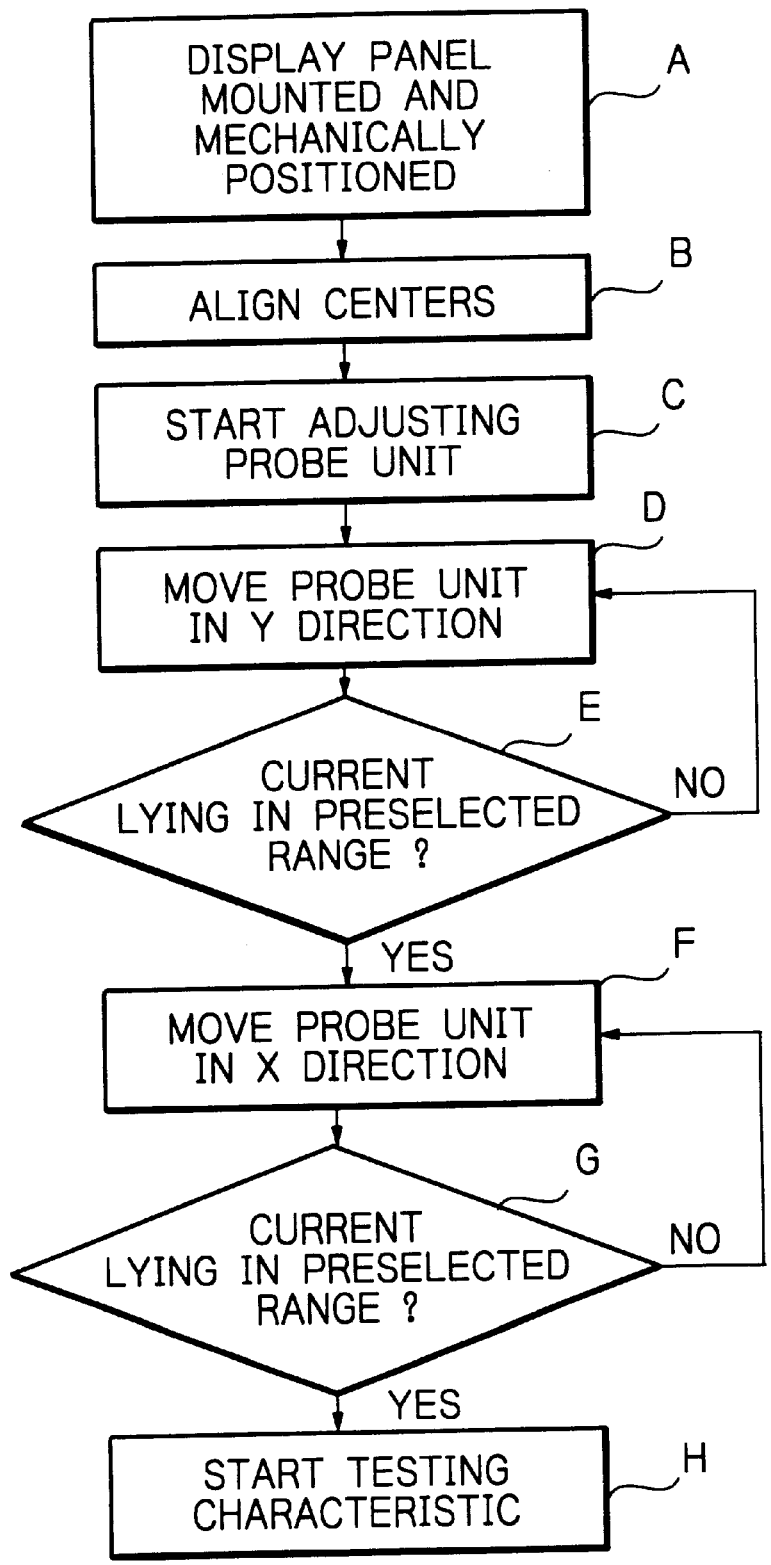
FIG. 3 is a flowchart demonstrating a specific operation of the illustrative embodiment.

Reference will be made to FIG. 3 for describing a specific operation of the above probe device. As shown, the display panel 20 is laid on the stage 9 and has its edges abutted against an X stop and a Y stop to be mechanically positioned thereby (step A). Then, a vacuum pump is operated to suck the display panel 20 onto the stage 9. While the display panel 20 is simply mechanically positioned in the step A, the center of the contour of the panel 20 and the center of a square or rectangular area defined by electrode terminals 21 arranged in perpendicular directions on the panel 20 by a film forming step are not always coincident.

In a step B following the step A, the center of the square or rectangular area defined by the electrode terminals 21 and the center of the square or rectangular area defined by the probes 14 are aligned. Specifically, cruciform alignment marks positioned at two of four corners of the display panel 20 are respectively identified by the alignment cameras 7. The positions of the alignment marks are compared with reference X and Y axes stored in the controller 4. If an X axis or a Y axis represented by either one of the alignment marks is inclined relative to the reference X axis or Y axis, then a CPU (Central Processing Unit) included in the controller 4 calculates the inclination, determines a deviation, and rotates the compound table 10 by an angle corresponding to the deviation for thereby correcting the deviation. Further, if the coordinates of either one of the alignment marks are deviated in the X direction or Y direction, then the compound table 10 is so shifted in the X direction or Y direction as to correct the deviation.

The above alignment scheme is conventional and automatically practiced by a numerical control mechanism using a microcomputer built in the controller 4, a pulse generating power source, and a pulse motor for driving the compound table 10. For easy calculation and control, a turn table should preferably be positioned on the top. When both of the two alignment marks are slightly deviated in the X and Y directions, correction is effected on the basis of the mean values of deviations.

In a step C shown in FIG. 3, the probes 14 of each probe unit 2 and the associated electrode terminals 21 are brought into alignment. In the illustrative embodiment, two outermost probes 14 (A and B, FIGS. 2A and 2B) and electrode terminals 21 facing them are aligned with each other. Specifically, a voltage is applied to the two probes 14 in order to measure the resistance of circuitry arranged in the display panel 20 via the electrode terminals 21 contacting the two probes 14. If a current lying in a preselected range flows in response to the above voltage, then it is determined that the probes 14 and electrode terminals 21 are aligned with each other. Let the direction in which the array of probes 2 extend and the direction perpendicular thereto be referred to as the X direction and Y direction, respectively.

In the step C, the probe head 6 is first lowered to receive the display panel 20 in the opening 19 of the base plate 6a. Then, a pressing mechanism using a piezoelectric device presses the probes 14 against the electrode terminals 21 with a preselected pressure. A medium voltage is applied to the piezoelectric devices 13a and 13b of each actuator 3 in order to hold the probe unit 2 in its medium position.

In a step D, a program sequencer starts operating and causes the probe units 2 to move together by one step in the front-and-rear direction, i.e., direction Y. Whether or not the current has changed as a result of such movement is determined. Also, in a step E, whether or not the current flowing through the two probes lies in a preselected range is determined. If the current has not changed and if it lies in the preselected range, the probe unit 2 is held in its medium position. Any one of the probe units 2 whose current has not changed, but is short of the preselected range, is moved by two additional steps in the front-and-rear direction. Then, whether or not the current lies in the preselected range is again determined. When the current lies in the preselected range, the voltage is continuously applied to the piezoelectric device 13b so as to maintain the probe unit 2 at such a position.

The above procedure is repeated with all of the probe units 2 in the Y direction. Subsequently, in a step F, each probe unit 2 is moved, one step at a time, in the right-and-left direction or X direction. In a step G, whether or not the current has changed as a result of the movement and whether or not a preselected current is flowing are determined. If a current of preselected value or above is flowing, the probe unit 2 is held in its medium position. If the current is above the preselected value, the probe unit 2 is held in its medium position although the current has changed. If the current has changed and is short of the preselected value, the probe 2 is shifted by two steps in the right-and-left direction in order to see if the current reaches the preselected value or not. If the current reaches the preselected value when the probe 2 is shifted to the right, then the probe unit 2 is held in the right position.

The steps F and G are repeated with all of the probe units 2. After the completion of the positioning procedure, a step H is executed for starting testing the electric characteristic of the display panel 20. To test a display panel whose electrode terminals 21 have a comparatively great pitch, the probe unit 2 shown in FIG. 2A will be replaced with the probe unit 2a shown in FIG. 2B.

In the illustrative embodiment, each actuator is provided with a mechanism for moving the associated probe unit in both of the right-and-left and front-and-rear directions. Such a mechanism may be replaced with a mechanism capable of moving the probe unit only in the X direction. This is because the electrode terminals are elongate in the direction in which the probes extend, but each has a small width. That is, the electrode terminals are sparingly deviated in the front-and-rear direction or Y direction and often deviated in the right-and-left direction or X direction.

A mechanism for rotating the probe units is similarly applicable to the illustrative embodiment. Specifically, a rotary shaft may be affixed to the rear end of the movable portion 3a, FIG. 2C, close to the flat cable 11, and a crank arm may be mounted on the other end of the rotary shaft. In such a case, the crank arm can be delicately moved to rotate the probe unit by a small angle as if the probe unit were slightly moved in the X direction.

In summary, it will be seen that the present invention provides a probe device and a probe positioning method adaptive to various display panels each having electrode terminals arranged at a particular pitch, without resorting to additional probe units. The probe device is therefore feasible for general-purpose applications and low in operation cost. In addition, the probe device allows electrode terminals and probes to be accurately positioned relative to each other. This enhances accurate testing, surely excludes defective products, and frees the subsequent steps from wasteful cost.

Various modifications will become possible for those skilled in the art after receiving the teachings of the present disclosure without departing from the scope thereof.

What is claimed is:

1. A probe device for a display panel, comprising:
   a first probe unit including a plurality of probes capable of contacting electrode terminals arranged on the display panel at first preselected intervals;
   a second probe unit including a plurality of probe units capable of contacting electrode terminals arranged at second preselected intervals different from said first preselected intervals;
   an actuator including a connecting mechanism for allowing either one of said first probe unit and said second probe unit to be plugged in said actuator, and a moving mechanism for moving said first or said second probe unit plugged in;
   a probe head including a base plate on which a plurality of probe assembly units each comprising said actuator and said first or said second probe unit are arranged side by side along edges of an opening formed in said base plate;
   a stage on which the display panel is laid;
   a compound table for selectively moving said stage in a rotational direction or in an X or a Y direction;
   alignment cameras for identifying alignment marks provided on the display panel; and
   a controller for driving said actuator, interchanging signals with said first or said second probe and a tester body, and performing sequence control.

2. A probe device as claimed in claim 1, wherein said moving mechanism moves said first or said second probe unit in a direction in which said probes are arranged in an array and a direction perpendicular to said direction.

3. A probe device as claimed in claim 2, wherein said moving mechanism moves said first or said second probe unit stepwise.

4. A probe positioning method comprising the steps of:
   aligning a center of a square or rectangular area defined by electrode terminals arranged in perpendicular directions on a display panel and a center of a square or rectangular area defined by probes arranged in perpendicular directions on a probe head;
   causing said probes to contact said electrode terminals;
   dividing said probes into a plurality of blocks each having a preselected number of probes; and
   positioning each of said plurality of blocks while applying a voltage and measuring a resistance of circuitry including outermost probes of the block and the electrode terminals contacting said outermost probes, wherein a current value is determined to thereby assure alignment of said probes and said electrode terminals prior to testing of said display panel.

* * * * *

UNITED STATES PATENT AND TRADEMARK OFFICE
CERTIFICATE OF CORRECTION

PATENT NO. : 6,137,300
DATED : October 24, 2000
INVENTOR(S) : Manabu Hayashida

It is certified that error appears in the above-identified patent and that said Letters Patent is hereby corrected as shown below:

Column 2, line 66, delete "6aside" insert --6a side--.

Signed and Sealed this

First Day of May, 2001

Attest:

NICHOLAS P. GODICI

*Attesting Officer*     *Acting Director of the United States Patent and Trademark Office*